United States Patent

(12) United States Patent
Sandhu et al.

(10) Patent No.: US 6,746,934 B2
(45) Date of Patent: Jun. 8, 2004

(54) ATOMIC LAYER DOPING APPARATUS AND METHOD

(75) Inventors: Gurtej Sandhu, Boise, ID (US); Trung T. Doan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 143 days.

(21) Appl. No.: 10/301,573

(22) Filed: Nov. 22, 2002

(65) Prior Publication Data

US 2003/0073318 A1 Apr. 17, 2003

Related U.S. Application Data

(63) Continuation of application No. 09/653,553, filed on Aug. 31, 2000, now Pat. No. 6,541,353.

(51) Int. Cl.$^7$ .................................................. H01L 21/20
(52) U.S. Cl. ..................................... 438/428; 438/558
(58) Field of Search ................... 427/255.23, 255.26, 427/255.38, 255.34, 248.1; 118/718, 719; 438/478, 479, 542, 558, 559, 567, 565, 566, 795

(56) References Cited

U.S. PATENT DOCUMENTS

| | | | |
|---|---|---|---|
| 3,811,826 A | | 5/1974 | Enderlein |
| 4,533,410 A | | 8/1985 | Ogura et al. |
| 4,786,616 A | | 11/1988 | Awal, et al. |
| 4,951,601 A | * | 8/1990 | Maydan et al. ............ 118/719 |
| 5,013,683 A | * | 5/1991 | Pertoff et al. |
| 5,281,274 A | | 1/1994 | Yoder |
| 5,298,542 A | * | 3/1994 | Mayerson |
| 5,310,698 A | | 5/1994 | Wild |
| 5,527,733 A | | 6/1996 | Nishizawa et al. |
| 5,793,109 A | | 8/1998 | Nakamura |
| 5,916,365 A | * | 6/1999 | Sherman |
| 6,048,781 A | * | 4/2000 | Turner et al. ............... 438/486 |
| 6,305,314 B1 | * | 10/2001 | Sneh et al. |
| 6,482,733 B2 | * | 11/2002 | Raaijmakers et al. |
| 6,503,330 B1 | * | 1/2003 | Sneh et al. |
| 6,576,062 B2 | * | 6/2003 | Matsuse |
| 2003/0054133 A1 | * | 3/2003 | Wadley et al. |

FOREIGN PATENT DOCUMENTS

| | | |
|---|---|---|
| DE | 1758751 | 2/1971 |
| EP | 0840355 A1 | 5/1998 |
| JP | 01278714 | 11/1989 |

OTHER PUBLICATIONS

Gruetzmacher, et al., "Atomic Layer Doping for SI," Thin Solid Films, Elsevier–Sequoia S.A., Lausanne, Ch, vol. 225, No. 1/2, Mar. 25, 1993, pp. 163–167, XP000358305, ISSN: 0040–6090, pp. 163–164.

* cited by examiner

*Primary Examiner*—Savitri Mulpuri
(74) *Attorney, Agent, or Firm*—Dickstein Shapiro Morin & Oshinsky LLP

(57) ABSTRACT

An improved atomic layer doping apparatus is disclosed as having multiple doping regions in which individual monolayer species are first deposited and then dopant atoms contained therein are diffused into the substrate. Each doping region is chemically separated from adjacent doping regions. A loading assembly is programmed to follow predefined transfer sequences for moving semiconductor substrates into and out of the respective adjacent doping regions. According to the number of doping regions provided, a plurality of substrates could be simultaneously processed and run through the cycle of doping regions until a desired doping profile is obtained.

17 Claims, 5 Drawing Sheets

ATOMIC LAYER DOPING APPARATUS AND METHOD

This is a continuation of U.S. patent application Ser. No. 09/653,553, filed Aug. 31, 2000, now U.S. Pat. No. 6,541,353 the entire disclosure of which is incorporated herein by reference.

FIELD OF THE INVENTION

The present invention relates to the field of semiconductor integrated circuits and, in particular, to an improved method for doping wafers.

BACKGROUND OF THE INVENTION

Incorporation of dopants or chosen impurities into a semiconductor material, commonly known as doping, is well known in the art. Thermal diffusion and ion implantation are two methods currently used to introduce a controlled amount of dopants into selected regions of a semiconductor material.

Doping by thermal diffusion is a two-step process. In the first step, called predeposition, the semiconductor is either exposed to a gas stream containing excess dopant at low temperature to obtain a surface region saturated with the dopant, or a dopant is diffused into a thin surface layer from a solid dopant source coated onto the semiconductor surface. The predeposition step is followed by the drive-in step, during which the semiconductor is heated at high temperatures in an inert atmosphere so that the dopant in the thin surface layer of the semiconductor is diffused into the interior of the semiconductor, and thus the predeposited dopant atoms are redistributed to a desired doping profile.

Ion implantation is preferred over thermal diffusion because of the capability of ion implantation to control the number of implanted dopant atoms, and because of its speed and reproducibility of the doping process. The ion implantation process employs ionized-projectile atoms that are introduced into solid targets, such as a semiconductor substrate, with enough kinetic energy (3 to 500 KeV) to penetrate beyond the surface regions. A typical ion implant system uses a gas source of dopant, such as, $BF_3$, $PF_3$, $SbF_3$, or $AsH_3$, for example, which is energized at a high potential to produce an ion plasma containing dopant atoms. An analyzer magnet selects only the ion species of interest and rejects the rest of species. The desired ion species are then injected into an accelerator tube, so that the ions are accelerated to a high enough velocity to acquire a threshold momentum to penetrate the wafer surface when they are directed to the wafers.

Although ion implantation has many advantages, such as the ability to offer precise dopant concentrations, for example, for silicon of about $10^{14}$ to $10^{21}$ atoms/cm$^3$, there are various problems associated with this doping method. For example, a major drawback for ion implantation is the radiation damage, which occurs because of the bombardment involved with heavy particles and further affects the electrical properties of the semiconductor. The most common radiation damage is the vacancy-interstitial defect, which occurs when an incoming dopant ion knocks substrate atoms from a lattice site and the newly dislocated atoms rest in a non-lattice position. Further, most of the doping atoms are not electrically active right after implantation mainly because the dopant atoms do not end up on regular, active lattice sites. By a suitable annealing method, however, the crystal lattice could be fully restored and the introduced dopant atoms are brought to electrically active lattice sites by diffusion.

Ion channeling is another drawback of ion implantation that could also change the electrical characteristics of a doped semiconductor. Ion channeling occurs when the major axis of the crystal wafer contacts the ion beam, and when ions travel down the channels, reaching a depth as much as ten times the calculated depth. Thus, a significant amount of additional dopant atoms gather in the channels of the major axis. Ion channeling can be minimized by several techniques, such as employing a blocking amorphous surface layer or misorienting the wafer so that the dopant ions enter the crystal wafer at angles different than a 90° angle. For example, misorientation of the wafer 3 to 7° off the major axis prevents the dopant ions from entering the channels. However, these methods increase the use of the expensive ion-implant machine and, thus, could be very costly for batch processing.

Another disadvantage of the conventional doping methods is the autodoping. After dopants are incorporated into a crystalline wafer to form various junctions, they undergo many subsequent processing steps for device fabrication. Although efforts are made to use low-temperature processing techniques to minimize redistribution of incorporated dopant atoms, the dopants still redistribute during the course of further processing. For example, this redistribution of dopants becomes extremely important when an epitaxial film is grown over the top of the doped area, particularly because of the high temperature required for epitaxial growth. At high temperatures, the dopant diffuses into the growing epitaxial film during the epitaxial growth, and this phenomenon is referred to as autodoping. This phenomenon also leads to unintentional doping of the film in between the doped regions, or into the nondiffused substrate. For this, integrated circuit designers must leave adequate room between adjacent regions to prevent the laterally diffused regions from touching and shorting.

Furthermore, current doping systems today employ a batch processing, in which wafers are processed in parallel and at the same time. An inherent disadvantage of batch processing is cross contamination of the wafers from batch to batch, which further decreases the process control and repeatability, and eventually the yield, reliability and net productivity of the doping process.

Accordingly, there is a need for an improved doping system, which will permit minimal dopant redistribution, precise control of the number of implanted dopants, higher commercial productivity and improved versatility. There is also needed a new and improved doping system and method that will eliminate the problems posed by current batch processing technologies, as well as a method and system that will allow greater uniformity and doping process control with respect to layer thickness necessary for increasing density of integration in microelectronics circuits.

SUMMARY OF THE INVENTION

The present invention provides an improved method and unique atomic layer doping system and method for wafer processing. The present invention contemplates an apparatus provided with multiple doping regions in which individual monolayers of dopant species are first deposited by atomic layer deposition (ALD) on a wafer and then the respective dopants are diffused, by thermal reaction, for example, into the wafer surface. Each doping region of the apparatus is chemically isolated from the other doping regions, for example, by an inert gas curtain. A robot is programmed to follow pre-defined transfer sequences to move wafers into and out of respective doping regions for processing. Since multiple regions are provided, a multitude of wafers can be simultaneously processed in respective regions, each region depositing only one monolayer dopant species and subsequently diffusing the dopant into the wafer. Each wafer can be moved through the cycle of regions until a desired doping concentration and profile is reached.

The present invention allows for the atomic layer doping of wafers with higher commercial productivity and improved versatility. Since each region may be provided with a pre-determined set of processing conditions tailored to one particular monolayer dopant species, cross contamination is also greatly reduced.

These and other features and advantages of the invention will be apparent from the following detailed description which is provided in connection with the accompanying drawings, which illustrate exemplary embodiments of the invention.

DETAILED DESCRIPTION OF THE PREFERRED EMBODIMENTS

Figure 1:
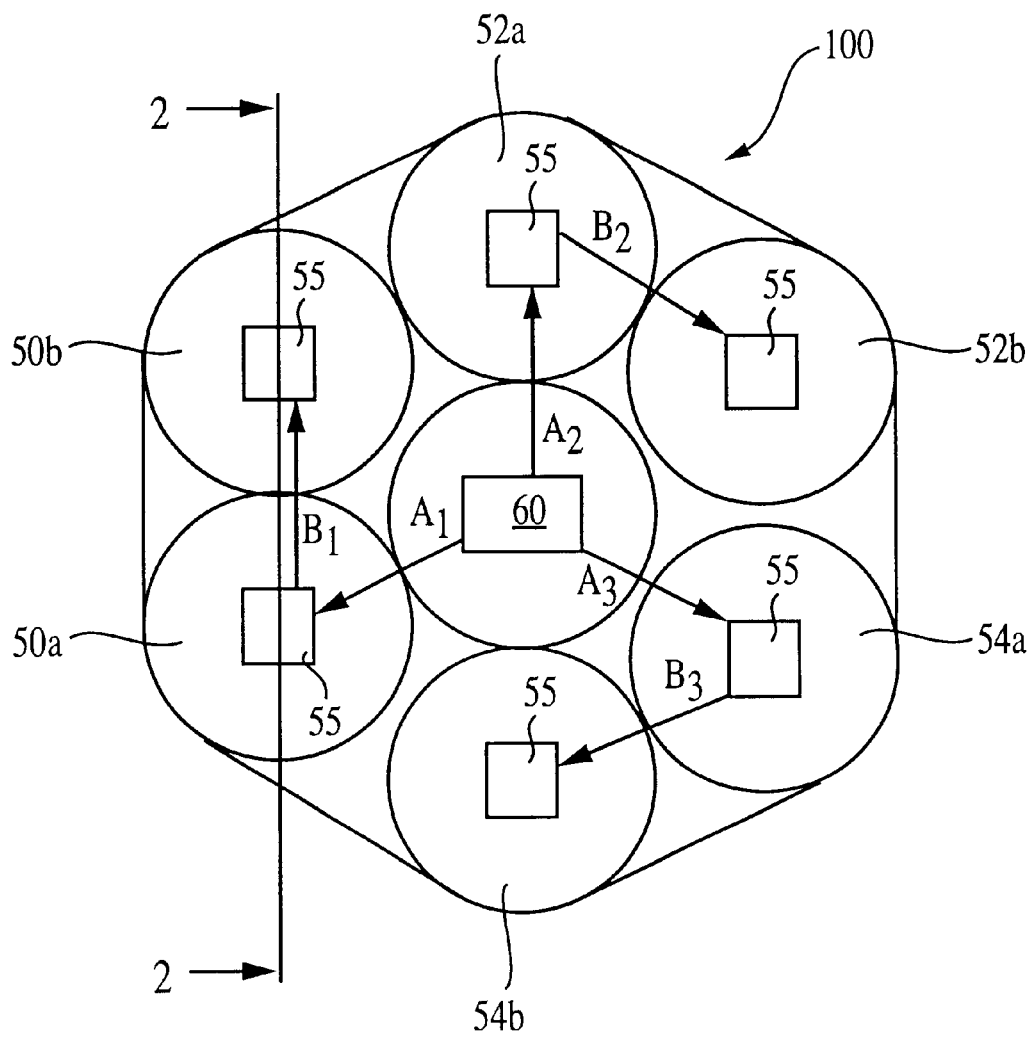
FIG. 1 illustrates a schematic top view of a multiple-chamber atomic layer doping apparatus according to the present invention.

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "dopant" is intended to include not only elemental dopant atoms, but dopant atoms with other trace elements or in various combinations with other elements as known in the semiconductor art, as long as such combinations retain the physical and chemical properties of the dopant atoms.

The term "p-type dopant" used in the following description may include any p-type impurity ions, such as zinc (Zn), magnesium (Mg), beryllium (Be), boron (B), gallium (Ga) or indium (In), among others. The term "n-type dopant" may include any n-type impurity ions, such as silicon (Si), sulfur (S), tin (Sn), phosphorus (P), arsenic (As) or antimony (Sb), among others.

The present invention provides an atomic layer doping method and apparatus. As it will be described in more details below, the apparatus is provided with multiple doping regions in which individual monolayer dopant species are first deposited on a substrate and then dopant atoms corresponding to each of the monolayer species are diffused into respective substrates. Each doping region is chemically separated from the adjacent doping regions. A robot is programmed to follow pre-defined transfer sequences for moving wafers into and out of the respective adjacent doping regions. According to the number of doping regions provided, a multitude of substrates could be simultaneously processed and run through the cycle of different doping regions until a desired doping concentration of a wafer surface is completed.

The present invention provides a simple and novel multi-chamber system for atomic layer doping processing. Although the present invention will be described below with reference to the atomic layer deposition of a dopant species Ax and the subsequent diffusion of its dopant atoms into a wafer, it must be understood that the present invention has equal applicability for the formation of any doped material capable of being formed by atomic layer doping techniques using any number of species, where each dopant species is deposited in a reaction chamber dedicated thereto.

A schematic top view of a multiple-chamber atomic layer doping apparatus 100 of the present invention is shown in FIG. 1. According to an exemplary embodiment of the present invention, doping regions 50a, 50b, 52a, 52b, 54a, and 54b are alternately positioned around a loading mechanism 60, for example a robot. These doping regions may be any regions for the atomic layer doping treatment of substrates. The doping regions may be formed as cylindrical reactor chambers, 50a, 50b, 52a, 52b, 54a, and 54b, in which adjacent chambers are chemically isolated from one another.

Figure 2:
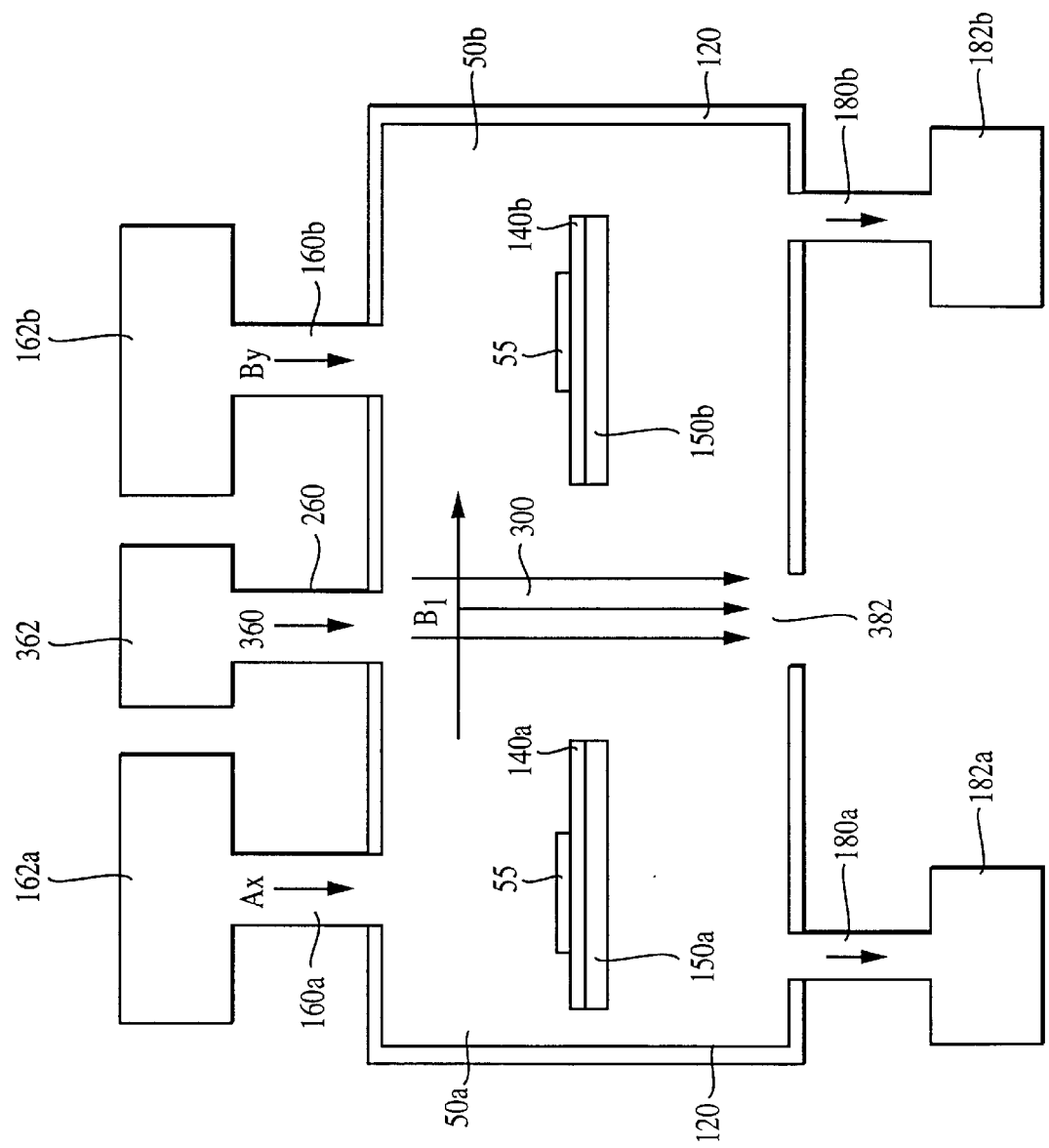
FIG. 2 is a partial cross-sectional view of the atomic layer doping apparatus of FIG. 1, taken along line 2—2' and depicting two adjacent doping regions according to a first embodiment of the present invention and depicting one wafer transfer sequence.

To facilitate wafer movement, and assuming that only one monolayer of a dopant species Ax is to be deposited per cycle, the reactor chambers are arranged in pairs 50a, 50b; 52a, 52b; 54a, 54b. One such pair, 50a, 50b is shown in FIG. 2. While one of the reactor chambers of a pair, for example 50a, deposits one monolayer of the dopant species Ax, the other reactor chamber of the pair, for example 50b, facilitates subsequent diffusion of the dopant atoms of species Ax into the wafer to complete the doping process. The adjacent reactor chamber pairs are chemically isolated from one another, for example by a gas curtain, which keeps the monolayer of dopant species Ax in a respective region, for example 50a, and which allows wafers treated in one reaction chamber, for example 50a, to be easily transported by the robot 60 to the other reaction chamber 50b, and vice versa. Simultaneously, the robot can also move wafers between chambers 52a or 52b, and 54a and 54b.

In order to chemically isolate the paired reaction chambers 50a, 50b; 52a, 52b; and 54a, 54b, the paired reaction chambers show a wall through which the wafers may pass, with the gas curtain acting in effect as a chemical barrier preventing the gas mixture within one chamber, for example 50a, from entering the paired adjacent chamber, for example 50b.

It should be noted that, when a particular doping concentration and/or profile is required, the robot can simply move wafers back and forth between the adjacent chambers, for example 50a, 50b, until the desired doping profile and/or concentration of the wafer is obtained.

It should also be noted that, while two adjacent chambers have been illustrated for doping of a substrate using monolayers of dopant species Ax, one or more additional chambers, for example 50c, 52c, 54c, may also be used for deposition of additional respective monolayers of dopant species, such as By, for example, with the additional chambers being chemically isolated from the chambers depositing the Ax monolayer dopant species in the same way the chambers for depositing the Ax species are chemically isolated.

The loading assembly 60 of FIG. 1 may include an elevator mechanism along with a wafer supply mechanism. As well-known in the art, the supply mechanism may be further provided with clamps and pivot arms, so that a wafer 55 can be maneuvered by the robot and positioned according to the requirements of the atomic layer doping processing described in more detail below.

Further referring to FIG. 1, a processing cycle for atomic layer doping on a wafer 55 begins by selectively moving a first wafer 55, from the loading assembly 60 to the chamber reactor 50a, in the direction of arrow $A_1$ (FIG. 1). Similarly, a second wafer 55' may be selectively moved by the loading assembly 60 to the chamber reactor 52a, in the direction of arrow $A_2$. Further, a third wafer 55" is also selectively moved by the loading assembly 60 to the chamber reactor 54a, in the direction $A_3$. At this point, each of chambers 50a, 52a, 54a are ready for atomic layer deposition of a monolayer of a dopant species, for example Ax.

FIG. 2 illustrates a cross-sectional view of the apparatus 100 of FIG. 1, taken along line 2—2'. For simplicity, FIG. 2 shows only a cross-sectional view of adjacent reactor chambers 50a and 50b. In order to deposit an atomic monolayer on the wafer 55, the wafer 55 is placed inside of the reactor chamber 50a, which may be provided as a quartz or aluminum container 120. The wafer 55 is placed by the loading assembly 60 (FIG. 1) onto a susceptor 140a (FIG. 2), which in turn is situated on a heater assembly 150a. Mounted on the upper wall of the reactor chamber 50a is a dopant gas supply inlet 160a, which is further connected to a dopant gas supply source 162a for a first dopant gas precursor Ax. An exhaust outlet 180a, connected to an exhaust system 182a, is situated on the opposite wall from the dopant gas supply inlet 160a.

The wafer 55 is positioned on top of the susceptor 140a (FIG. 2) by the loading assembly 60, and then a first dopant gas precursor Ax is supplied into the reactor chamber 50a through the dopant gas inlet 160a. The first dopant gas precursor Ax flows at a right angle onto the wafer 55 and reacts with its top substrate surface to form a first monolayer 210a of the first dopant species Ax, by an atomic layer deposition mechanism. Preferred gas sources of dopants are hydrated forms of dopant atoms such as arsine ($AsH_3$) and diborane ($B_2H_6$). These gases are mixed in different dilutions in pressurized containers, such as the dopant gas supply source 162a (FIG. 2), and connected directly to the dopant gas inlets, such as the dopant gas inlet 160a (FIG. 2). Gas sources offer the advantage of precise control through pressure regulators and are favored for deposition on larger wafers.

Alternatively, a liquid source of dopant such as chlorinated or brominated compounds of the desired element may be used. When a liquid source of dopant is used, a boron liquid source, for example boron tribromide ($BBr_3$), or a phosphorous liquid source, for example phosphorous oxychloride ($POCl_3$), may be held in temperature-controlled flasks over which an inert gas, such as nitrogen ($N_2$), is bubbled through the heated liquid, so that the gas becomes saturated with dopant atoms. The inert gas carries the dopant vapors through a gas tube and creates a laminar flow of dopant atoms. A reaction gas is also required to create the elemental dopant form in the tube. For $BBr_3$, for example, the reaction gas is oxygen, which creates the boron trioxide ($B_2O_3$) which further deposits as a monolayer of boron trioxide on the surface of the wafer.

In any event, after, the deposition of a monolayer of the first dopant species Ax on the wafer surface 55, the processing cycle for the wafer 55 continues with the removal of the wafer 55 from the chamber reactor 50a to the chamber reactor 50b, in the direction of arrow $B_1$, as also illustrated in FIG. 1. After the deposition of the first monolayer 210a of the first dopant species Ax, the wafer 55 is moved from the reactor chamber 50a, through a gas curtain 300 (FIG. 2), to the reactor chamber 50b, by the loading assembly 60 (FIG. 1) and in the direction of arrow $B_1$ of FIG. 2. It is important to note that the gas curtain 300 provides chemical isolation between adjacent deposition regions.

The loading assembly 60 moves the wafer 55 through the gas curtain 300, onto the susceptor 140b situated in the reactor chamber 50b, which, in contrast with the reactor chamber 50a, contains no dopant source and no dopant species. A heater assembly 150b is positioned under the susceptor 140b to facilitate the diffusion of the dopant atoms from the newly deposited first monolayer 210a of the first dopant species Ax into the wafer 55. The heat from the heater assembly 150b drives the dopant atoms into the wafer 55 and further redistributes the dopant atoms from the first monolayer 210a deeper into the wafer 55 to form a doped region 210b of the first dopant species Ax. During this step, the surface concentration of dopant atoms is reduced and the distribution of dopant atoms continues, so that a precise and shallow doping distribution in the doped region 210b of the wafer 55 is obtained. Accordingly, the depth of the doped region 210b of the wafer 55 is controlled, first, by the repeatability of the atomic layer deposition for the monolayers of dopant species and, second, by the degree of diffusion of dopants form the monolayers of dopant species into the wafers.

Alternatively, a plasma of a non-reactive gas may be used to complete the diffusion of the dopant atoms into the doped region 210b of the wafer 55. In this embodiment, a supply inlet 160b (FIG. 2), which is further connected to a non-reactive gas supply source 162b, for the plasma of the non-reactive gas, is mounted on the upper wall of the reactor chamber 50b. An exhaust inlet 180b, connected to an exhaust system 182b, is further situated on the opposite wall to the non-reactive gas supply inlet 160b.

Next, the non-reactive gas By is supplied into the reactor chamber 50b through the non-reactive gas inlet 160b, the non-reactive gas By flowing at a right angle onto the deposited first monolayer 210a of the first dopant species Ax. This way, particles of the non-reactive gas By "knock" the dopant atoms from the first monolayer 210a of the first doping species Ax into the wafer 55 to form the doped region 210b of the wafer 55.

Following the formation of the doped region 210b of the wafer 55, the process continues with the removal of the wafer 55 from the reactor chamber 50b, through the gas curtain 300, and into the reactor chamber 50a to continue the doping process. This process is repeated cycle after cycle, with the wafer 55 traveling back and forth between the reactor chamber 50a, and the reactor chamber 50b, to acquire the desired doping profile of the region 210b.

Once the desired doping profile of the wafer 55 has been achieved, an anneal step in the atomic layer doping process is required, to restore any crystal damage and to electrically activate the dopant atoms. As such, annealing can be achieved by a thermal heating step. However, the anneal temperature must be preferably below the diffusion temperature to prevent lateral diffusion of the dopants. Referring to FIG. 2, the anneal step could take place in the reactor chamber 50b, for example, by controlling the heat from the heater assembly 150b. Alternatively, the anneal step may take place into an adjacent reactor chamber, for example reactor chamber 52a, depending on the processing requirements and the desired number of wafers to be processed.

By employing chemically separate reactor chambers for the deposition process of species Ax dopant and possibly others, the present invention has the major advantage of allowing different processing conditions, for example, deposition or diffusion temperatures, in different reactor chambers. This is important since the chemisorption and reactivity requirements of the ALD process have specific temperature requirements, in accordance with the nature of the precursor gas. Accordingly, the apparatus of the present invention allows, for example, reactor chamber 50a to be set to a different temperature than that of the reactor chamber 50b. Further, each reactor chamber may be optimized either for improved chemisorption, reactivity or dopant conditions.

The configuration of the atomic layer doping apparatus illustrated above also improves the overall yield and productivity of the doping process, since each chamber could run a separate substrate, and therefore, a plurality of substrates could be run simultaneously at a given time. In addition, since each reactor chamber accommodates only one dopant species, cross-contamination from one wafer to another is greatly reduced. Moreover, the production time can be decreased since the configuration of the apparatus of the present invention saves a great amount of purging and reactor clearing time.

Of course, although the doping process was explained above only with reference to the first substrate 55 in the first chamber reactor 50a and the second chamber reactor 50b, it is to be understood that same processing steps are carried out simultaneously on the second and third wafers 55', 55" for their respective chamber reactors. Further, the second and third wafers 55', 55" are moved accordingly, in the directions of arrows $A_2$, $B_2$ (corresponding to chamber reactors 52a, 52b) and arrows $A_3$, $B_3$ (corresponding to chamber reactors 54a, 54b). Moreover, while the doping process was explained above with reference to only one first substrate 55 for the first and second reactor chambers 50a, 50b, it must be understood that the first and second reactor chambers 50a, 50b could also process another first substrate 55, in a direction opposite to that of processing the other first substrate. For example, if one first substrate 55 travels in the direction of arrow $B_1$ (FIG. 2) the other first substrate 55 could travel in the opposite direction of arrow $B_1$, that is from the second reactor chamber 50b to the first reactor chamber 50a.

Assuming a specific doping concentration is desired on the wafer 55, after the diffusion of the dopant atoms from the first monolayer 210a in the reactor chamber 50b, the wafer 55 is then moved back by the assembly system 60 to the reactor chamber 50a, where a second monolayer of the first dopant species Ax is next deposited over the first monolayer of the first dopant species Ax. The wafer 55 is further moved to the reactor chamber 50b for the subsequent diffusion of the dopant atoms from the second monolayer of the first dopant species Ax. The cycle continues until a desired doping concentration on the surface of the wafer 55 is achieved, and, thus, the wafer 55 travels back and forth between reactor chambers 50a and 50b. As explained above, the same cycle process applies to the other two wafers 55', 55" that are processed simultaneously in their respective reactor chambers.

Figure 3:
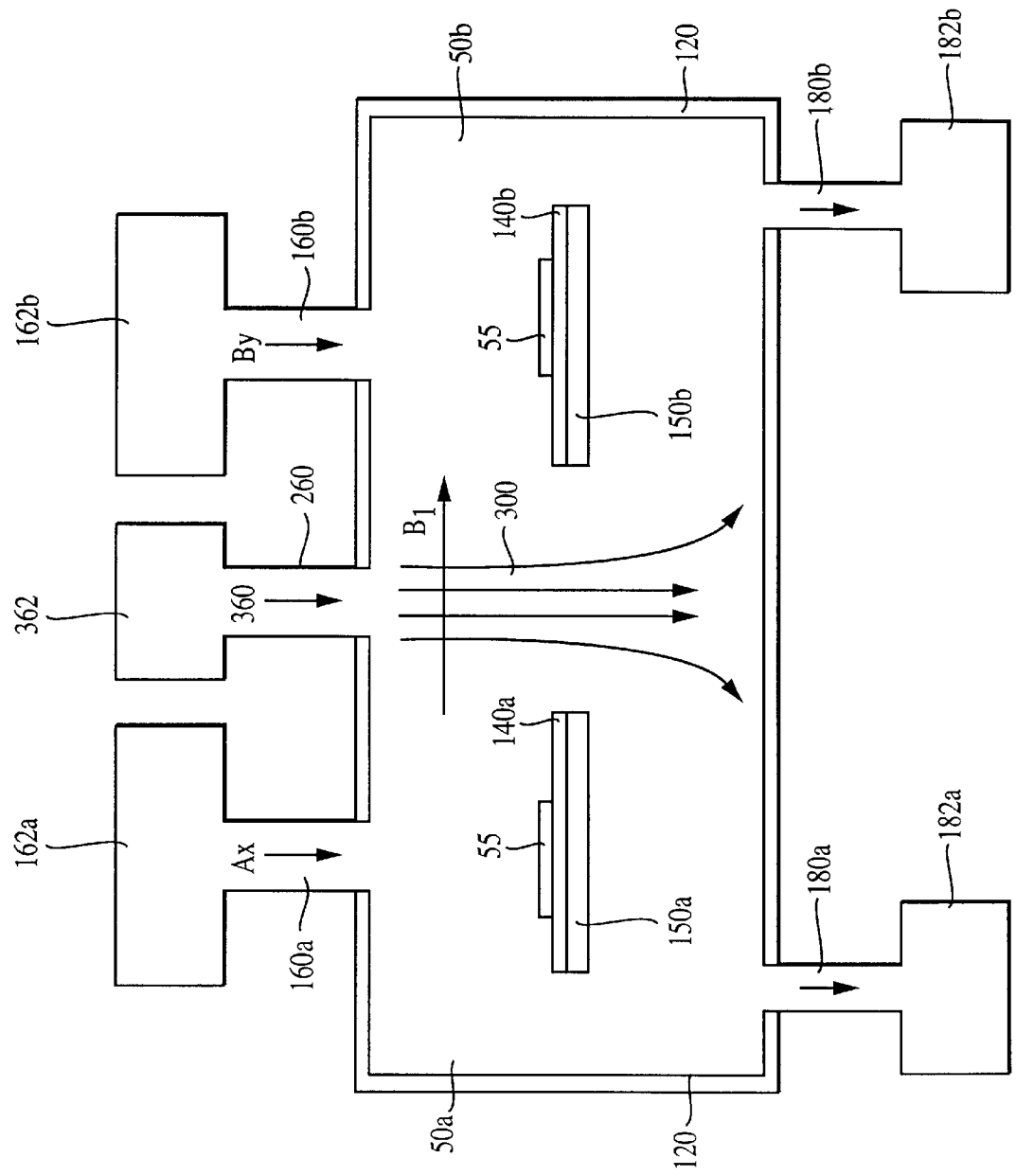
FIG. 3 is a partial cross-sectional view of the atomic layer doping apparatus of FIG. 1, taken along line 2—2' and depicting two adjacent doping regions according to a second embodiment of the present invention.

Although the invention is described with reference to reactor chambers, any other type of doping regions may be employed, as long as the wafer 55 is positioned under a flow of dopant source. The gas curtain 300 provides chemical isolation to all adjacent deposition regions. Thus, as illustrated in FIGS. 2–3, the gas curtain 300 is provided between the two adjacent reactor chambers 50a and 50b so that an inert gas 360, such as nitrogen, argon, or helium, for example, flows through an inlet 260 connected to an inert gas supply source 362 to form the gas curtain 300, which keeps the first dopant gas Ax and the non-reactive gas By from flowing into adjacent reaction chambers. An exhaust outlet 382 (FIG. 2) is further situated on the opposite wall to the inert gas inlet 260. It must also be noted that the pressure of the inert gas 360 must be higher than that of the first dopant gas Ax and that of the non-reactive gas By, so that the two doping gases Ax, By are constrained by the gas curtain 300 to remain within their respective reaction chambers.

FIG. 3 illustrates a cross-sectional view of the apparatus 100 of FIG. 2, with same adjacent reactor chambers 50a and 50b, but in which the inert gas 360 shares the exhaust outlets 180a and 180b with the two doping gases Ax and By, respectively. Thus, the atomic layer doping apparatus 100 may be designed so that the inert gas 360 of the gas curtain 300 could be exhausted through either one or both of the two exhaust outlets 180a and 180b, instead of being exhausted through its own exhaust outlet 382, as illustrated in FIG. 2.

Figure 4:
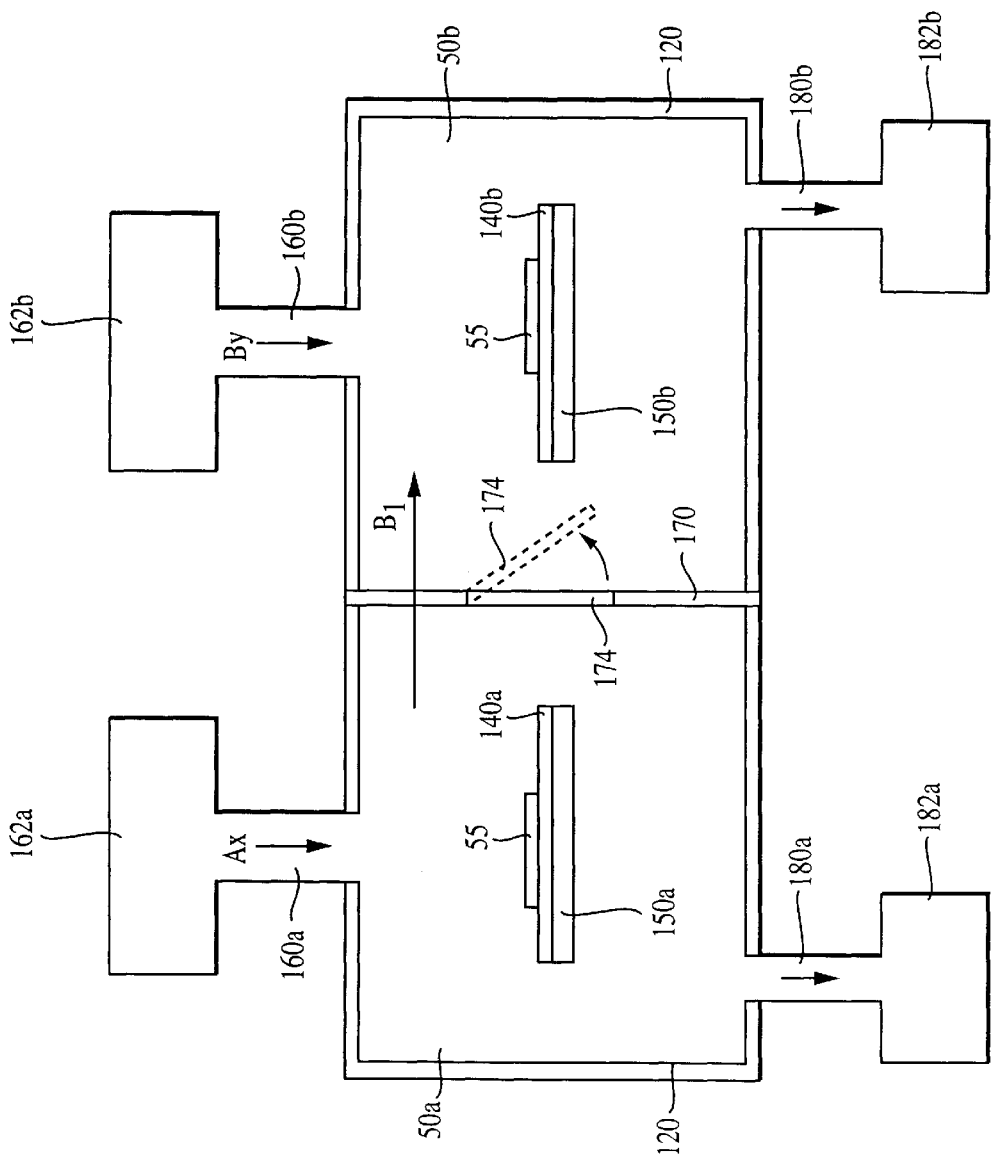
FIG. 4 is a partial cross-sectional view of the atomic layer doping apparatus of FIG. 2, depicting a physical barrier between two adjacent doping chambers.

FIG. 4 shows another alternate embodiment of the apparatus in which the gas curtain 300 separating adjacent chambers in FIGS. 2–3 is replaced by a physical boundary, such as a wall 170 having a closeable opening 172. A door 174 (FIG. 4) can be used to open and close the opening 172 between the adjacent paired chambers 50a, 50b. This way, the wafer 55 can be passed between the adjacent chambers 50a, 50b through the open opening 172 by the robot 60, with the door 174 closing the opening 172 during atomic layer doping processing.

Although the present invention has been described with reference to only three semiconductor substrates processed at relatively the same time in respective pairs of reaction chambers, it must be understood that the present invention contemplates the processing of any "n" number of wafers in their corresponding "m" number of reactor chambers, where n and m are integers. Thus, in the example shown in FIG. 1, n=3 and m=6, providing an atomic layer doping apparatus with at least 6 reaction chambers that could process simultaneously 3 wafers for a repeating two-step atomic layer doping using Ax as a dopant source and By as a non-reactive gas for diffusion. It is also possible to have n=2 and m=6 where two wafers are sequentially transported to and processed in the reaction chambers for sequential doping with two species, for example, Ax and a second dopant species Cz, while employing the non-reactive gas By to facilitate the diffusion of the dopant atoms Ax and Cz. Other combinations are also possible. Thus, although the invention has been described with the wafer 55 traveling back and forth from the reactor chamber 50a to the reactor chamber 50b with reference to FIG. 2, it must be understood that, when more than two reactor chambers are used for doping with more than two monolayer species Ax, Cz, the wafer 55 will be transported by the loading assembly 60 among all the reaction chambers in a sequence required to produce a desired doping profile.

Figure 5:
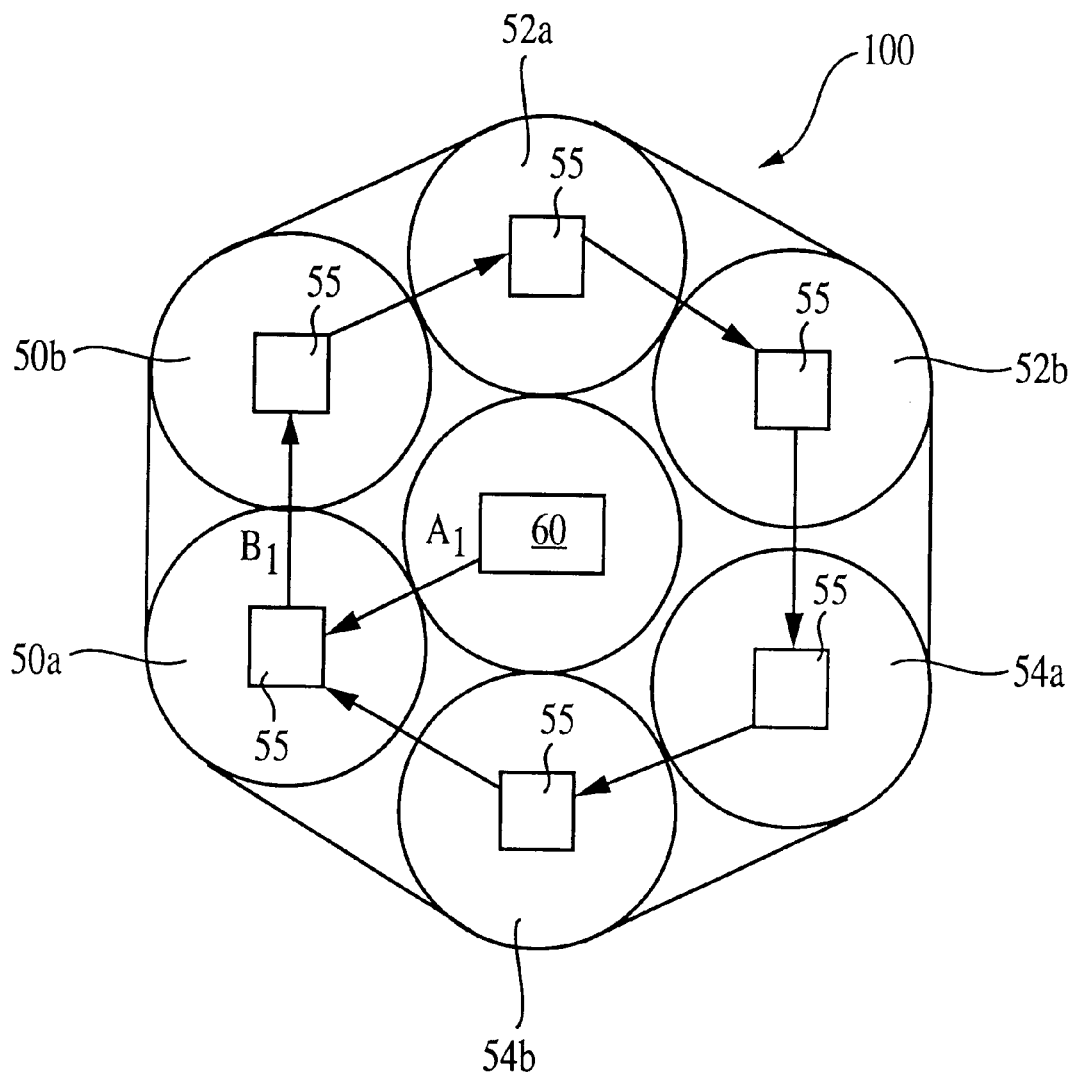
FIG. 5 is a schematic top view of a multiple-chamber atomic layer doping apparatus according to the present invention and depicting a second wafer transfer sequence.

Also, although the present invention has been described with reference to wafers 55, 55' and 55" being selectively moved by the loading assembly 60 to their respective reactor chambers 50a and 50b (for wafer 55), 52a and 52b (for wafer 55'), and 54a and 54b (for wafer 55"), it must be understood that each of the three above wafers or more wafers could be sequentially transported to, and processed in, all the reaction chambers of the apparatus 100. This way, each wafer could be rotated and moved in one direction only. Such a configuration is illustrated in FIG. 5, according to which a processing cycle for atomic layer deposition on a plurality of wafers 55, for example, begins by selectively moving each wafer 55, from the loading assembly 60 to the chamber reactor 50a, in the direction of arrow A, (FIG. 5), and then further to the reactor chamber 50b, 52a, 52b, 54a, and 54b. One reaction chamber, for example 50a, can serve as the initial chamber and another, for example 54b, as the final chamber. Each wafer 55 is simultaneously processed in a respective chamber and is moved sequentially through the chambers by the loading assembly 60, with the cycle continuing with wafers 55 traveling in one direction to all the remaining reactors chambers. Although this embodiment has been described with reference to a respective wafer in each chamber, it must be understood that the present invention contemplates the processing of any "n" number of wafers in corresponding "m" number of reactor chambers, where n and m are integers and n≦m. Thus, in the example shown in FIG. 5, the ALD apparatus with 6 reaction chambers could process simultaneously up to 6 wafers.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of operating an atomic layer doping apparatus, said doping apparatus comprising a first doping region and a second doping region, said method comprising the steps of:
    positioning a wafer in said first doping region;
    introducing a first dopant species into said first doping region and depositing said first dopant species on said wafer as a first atomic monolayer, said first atomic monolayer being deposited by atomic layer deposition;
    moving said wafer from said first doping region to said second doping region, said first and second doping regions being separated from one another by an inert gas curtain; and
    introducing dopants from said first atomic monolayer into said wafer in said second doping region.

2. The method of claim 1 further comprising the act of annealing said wafer after said act of introducing said dopants into said wafer.

3. The method of claim 1, wherein said act of introducing said dopants into said wafer includes diffusion of said dopants.

4. The method of claim 1, wherein said act of introducing said dopants into said wafer includes contacting said wafer with a non-reactive plasma.

5. The method of claim 1 further comprising the act of moving said wafer back and forth between said first and second doping regions.

6. The method of claim 1 further comprising the act of moving said wafer back to said first doping region and depositing said first dopant species as a second atomic monolayer.

7. The method of claim 1, wherein said first and second doping regions are adjacent to each other.

8. The method of claim 1 further comprising the act of simultaneously processing at least two wafers among said first and second doping regions and depositing a respective dopant species in each of said doping regions.

9. The method of claim 1, wherein said least two wafers are sequentially moved among said first and second doping regions.

10. A method of conducting atomic layer doping comprising the steps of;
    depositing a first atomic monolayer including atoms of a dopant species on a substrate in a first doping region, said first atomic monolayer being deposited by atomic layer deposition;
    moving said substrate from said first doping region to a second doping region, which is chemically isolated from said first doping region by an inert gas curtain; and
    introducing said atoms of said dopant species into said wafer in said second doping region.

11. The method of claim 10, wherein said act of depositing said first monolayer species further comprises introducing a first dopant species into said first doping region.

12. The method of claim 10, wherein said act of introducing said atoms of said dopant species into said wafer further comprises introducing a non-reactive plasma into said second doping region and contacting said non-reactive plasma with said first atomic monolayer species.

13. The method of claim 10, wherein said act of introducing said atoms of said dopant species into said wafer further comprises heating said wafer so that said atoms diffuse into a surface region of said wafer.

14. The method of claim 10 further comprising the act of annealing said wafer.

15. The method of claim 10 further comprising the act of moving said substrate back and forth between said first and second doping regions.

16. The method of claim 10, wherein a plurality of first and second doping regions are provided, and said method further comprising depositing said first monolayer on respective substrates and introducing atoms from said first monolayers into respective substrates in respective pairs of first and second doping regions, said first and second doping regions of each pair being adjacent to one another.

17. The method of claim 16, wherein a plurality of substrates, each of said plurality of substrates residing in respective regions, are moved sequentially from said first doping regions to said second doping regions.

* * * * *